United States Patent [19]
Lur et al.

[11] Patent Number: 6,013,569
[45] Date of Patent: Jan. 11, 2000

[54] ONE STEP SALICIDE PROCESS WITHOUT BRIDGING

[75] Inventors: Water Lur, Taipei; Tony Lin, Kaoshiung, both of Taiwan

[73] Assignee: United Microelectronics Corp., Hsinchu, Taiwan

[21] Appl. No.: 08/888,752

[22] Filed: Jul. 7, 1997

[51] Int. Cl.[7] .................... H01L 21/335; H01L 21/336; H01L 21/76; H01L 21/762

[52] U.S. Cl. .................... 438/595; 438/655; 438/660; 438/663; 438/664; 438/682; 438/685; 257/288; 257/368; 257/382; 257/384; 257/388; 257/412

[58] Field of Search .................... 438/655, 651, 438/664, 682, 303, 300, 305, 586, 202; 257/336, 72; 156/643; 96/38.4

[56] References Cited

U.S. PATENT DOCUMENTS

| | | | |
|---|---|---|---|
| 4,102,683 | 7/1978 | DiPiazza | 96/38.4 |
| 4,735,680 | 4/1988 | Yen | 156/643 |
| 4,818,715 | 4/1989 | Chao | 438/303 |
| 4,885,259 | 12/1989 | Osinski et al. | 438/303 |
| 4,906,589 | 3/1990 | Chao | 438/305 |
| 5,168,072 | 12/1992 | Moslehi | 438/300 |
| 5,196,360 | 3/1993 | Doan et al. | 438/586 |
| 5,702,972 | 12/1997 | Tsai et al. | 438/305 |
| 5,753,557 | 5/1998 | Tseng | 438/303 |
| 5,757,045 | 5/1998 | Tsai et al. | 257/336 |
| 5,759,882 | 6/1998 | Kao et al. | 438/202 |
| 5,770,507 | 6/1998 | Chen et al. | 438/305 |
| 5,783,486 | 7/1998 | Tseng | 438/682 |
| 5,804,838 | 9/1998 | Manning | 257/72 |

*Primary Examiner*—Tom Thomas
*Assistant Examiner*—Bernard E. Souw
*Attorney, Agent, or Firm*—Rabin & Champagne, P.C.

[57] ABSTRACT

Silicidation of a polysilicon line having free upper sidewalls is performed so that no stress is applied to the sidewalls of the polysilicon line, resulting in the formation of a reduced stress silicide structure. This is accomplished by forming a polysilicon line having spacers on either side which extend above the upper surface of the polysilicon line but which are spaced from the edge of the polysilicon line. A layer of a metal such as titanium or tungsten is provided in contact with the top surface polysilicon line. The structure is annealed to cause the metal to react with the polysilicon to form a layer of silicide. Since the upper side portions of the polysilicon line are spaced away from the spacers during the silicidation anneal, the growing silicide region has room to expand without being subjected to lateral stresses in the silicidation process. The suicide is formed in a reduced stress condition, as compared to conventional processes, so that the silicide layer produced will be more readily converted to the desired low resistivity phase of silicide.

31 Claims, 3 Drawing Sheets

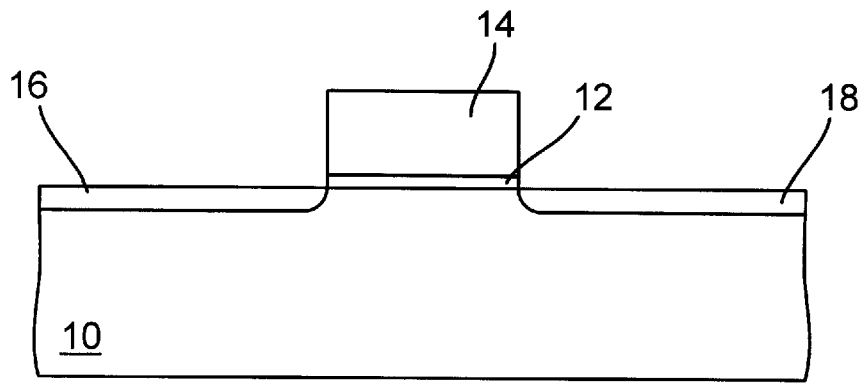
FIG. 1 - PRIOR ART
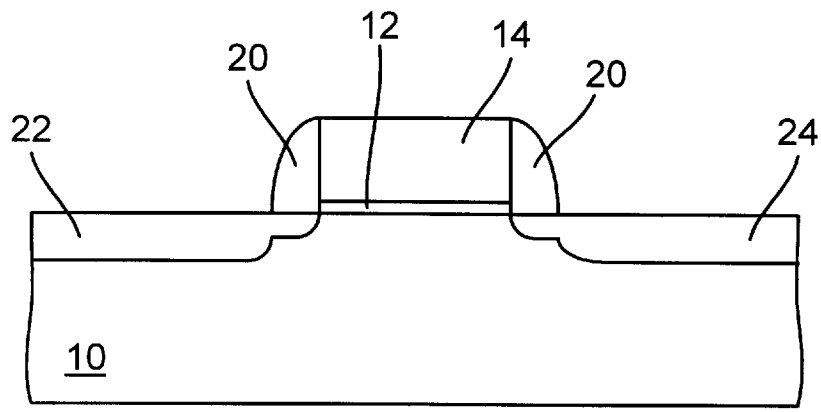
FIG. 2 - PRIOR ART
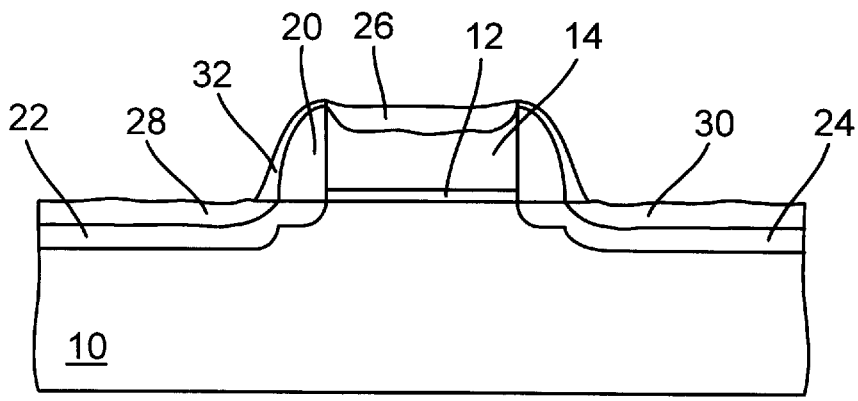
FIG. 3 - PRIOR ART

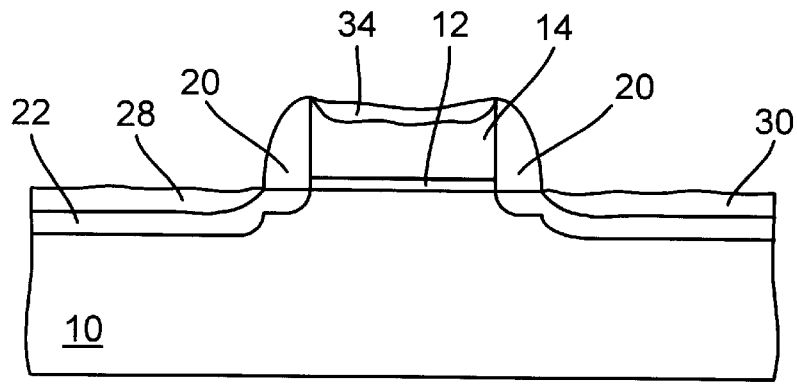
FIG. 4 – PRIOR ART
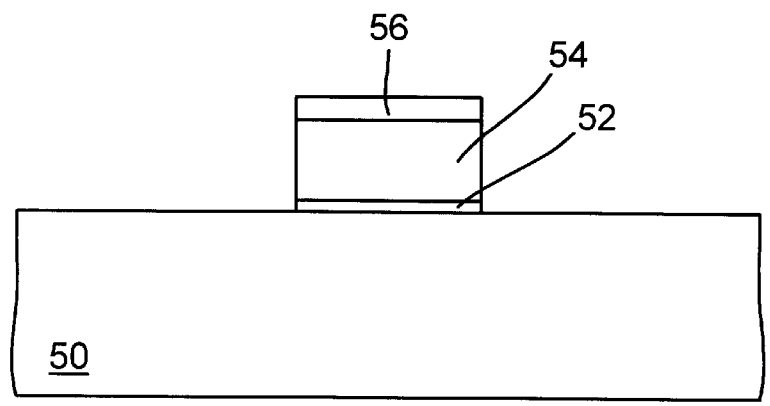
FIG. 5
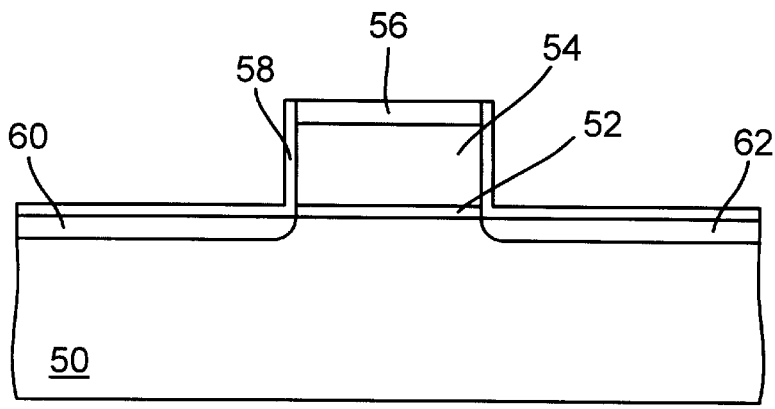
FIG. 6

ONE STEP SALICIDE PROCESS WITHOUT BRIDGING

BACKGROUND OF THE INVENTION

1. Field of the Invention

The present invention relates to semiconductor devices incorporating electrodes consisting of a layer of polysilicon covered by a self-aligned layer of metal silicide.

2. Description of the Related Art

As line widths and geometries for semiconductor devices are made smaller, the polysilicon electrodes that form the gates of MOS devices and wiring lines within semiconductor devices become undesirably resistive. Multilayer electrodes in which a layer of polysilicon is covered by one or more layers of metals or metal silicides are used to provide electrodes having a lower resistance than electrodes consisting solely of polysilicon. Silicide electrodes may consist, for example, of a layer of polysilicon having a thickness of approximately 1000 Å to 3000 Å covered by titanium suicide or another metal silicide to a thickness of greater than 100 Å. The silicide layer on the polysilicon layer acts as a lower resistance conduction path in parallel with the polysilicon layer over the entire length of the gate electrode. While it has become important to provide reduced conductivity gate electrodes in high density integrated circuit devices, there have been significant difficulties in implementing this technology in a reliable manner that predictably achieves high levels of performance.

A typical implementation of a multilayer, silicide on polysilicon electrode is the so-called self-aligned suicide ("salicide") structure, aspects of which are illustrated schematically in FIGS. 1–4. The illustrated MOS devices are formed on a P-type substrate 10 and include, for example, thick field oxide regions to provide isolation from other, adjacent MOS devices. As is conventional, the device isolation structures may be formed by a local oxidation of silicon (LOCOS) process or one of the modified LOCOS processes. Often, however, device isolation is provided by a shallow trench structure formed by etching a trench into the substrate and refilling the trenches with a deposited insulator, such as chemical vapor deposited (CVD) oxide. A gate oxide layer 12 is formed by thermal oxidation over the active device region between the device isolation structures and a polysilicon gate electrode 14 is formed on the gate oxide layer 12. The polysilicon gate electrode 14 is formed by depositing a layer of undoped polysilicon over the substrate, typically using low pressure chemical vapor deposition (LPCVD), implanting impurities into the polysilicon and annealing to activate the impurities and to render the polysilicon conductive. The polysilicon layer is patterned using conventional photolithography. Polysilicon wiring lines are typically formed elsewhere on the integrated circuit device at the same time and in the same manner as gate electrode 14 is formed.

Doped source/drain regions 16, 18 are formed on either side of the polysilicon gate electrode to define the channel region of the illustrated MOS field effect transistor. Generally, a lightly doped drain (LDD) structure is used in small design rule MOS transistors of the type that are frequently used in modem memory and logic devices. LDD source/drain regions are typically formed in a two step process, beginning with a relatively low level implantation of dopants made self-aligned to polysilicon gate electrode 14 to form the structure illustrated in FIG. 1. Subsequently, insulating sidewall spacer structures 20 (FIG. 2) arc formed on either side of the gate electrode by first depositing a layer of CVD oxide over the FIG. 1 structure and then anisotropically etching back the oxide layer to expose the substrate over the lightly doped source/drain regions 16, 18. Etching back the CVD oxide layer produces the spacer oxide structures 20 on either side of the polysilicon gate electrode 14. This process also provides spacer regions along the sides of the polysilicon wiring lines, if the wiring lines arc exposed during the oxide deposition and etch back process. After the spacer oxide regions 20 are provided on either side of the polysilicon gate electrode 14, a second, heavier ion implantation is made into the source/drain regions 22, 24 self-aligned to the spacer oxide regions 20.

Integrated circuit devices typically include both polysilicon gate electrodes, like gate electrode 14 shown in FIG. 2, and polysilicon wiring lines (not shown) which connect gate electrodes to other circuits and which provide other connections in the integrated circuit device. For smaller line widths, even highly doped polysilicon is sufficiently resistive to diminish the performance of MOS and other types of integrated circuits which include polysilicon electrodes or which are connected by polysilicon electrodes, due to decreased signal levels and longer RC time constants. To reduce the resistance of conventional polysilicon gate electrodes and wiring lines, further processing of the FIG. 2 device continues to convert the polysilicon gate electrodes and wiring lines into silicide structures using self-aligned silicide (salicide) techniques. Although a variety of different silicides are known to be acceptable, the silicide most commonly used at this time is titanium silicide, and that structure is described herein. Titanium silicide layers are formed on the polysilicon electrodes and wiring lines and select portions of the substrate, if desired, by first sputtering a layer of titanium over the surface of the device to a thickness of, for example, 500 Å. This titanium layer is converted into titanium silicide at the surface of the polysilicon gate electrodes and wiring lines and at the exposed portions of the substrate, including the source/drain regions 22, 24, in a two step process. In the first process step, the device is subjected to a rapid thermal anneal (RTA) by heating the device to a temperature of up to about 700° C. for about thirty seconds. The first RTA step converts the titanium layer into titanium silicide (nominally $TiSi_2$) anywhere the titanium layer is in contact with a silicon (crystalline or polycrystalline) surface. The device is then etched using a wet etch consisting of $H_2O_2$ and $NH_4OH$ diluted in water to remove unreacted titanium from the surface of the device and exposing the oxide regions of the device. A layer of titanium silicide 26 (FIG. 3) or 34 (FIG. 4) is left over the polysilicon gate electrode 14 and over the wiring line 18. When the source/drain regions 22, 24 are exposed during the silicidation process, titanium suicide regions 28, 30 are also formed on the surfaces of the source/drain regions 22, 24. Such titanium silicide regions 28, 30 are often preferred, particularly for logic devices, because silicided source/drain regions provide lower sheet resistance within the source/drain regions and provide better contacts to the source/drain regions 22, 24. Silicided contacts on the source/drain regions are thus preferred so long as the amount of silicon consumed in the silicidation process does not alter the transistor performance or result in excessive junction leakage at the source/drain regions.

After the unreacted titanium is etched from the device, further processing is necessary to provide suitable silicide layers on the gate electrodes and wiring lines of the device. The first step of the two step annealing process described to this point forms a relatively high resistivity phase of titanium silicide on the silicon surfaces, so that the illustrated salicide structure does not have as low a level of resistivity as is desirable. It is accordingly necessary to expose the device to a second step—a second rapid thermal anneal at a temperature in excess of 800° C. for at least ten seconds—to convert the titanium suicide to the lower resistivity phase of titanium silicide. The device is then subjected to further processing to complete fabrication.

A number of the processing steps necessary to the formation of salicide structures are critical. For example, if the temperature control is poor for the initial RTA step of converting the titanium in contact with silicon to titanium silicide, e.g., if the temperature for the initial anneal is near 800° C., then there may be rapid silicon transport laterally through the titanium layer, which could convert titanium to titanium silicide in undesirable regions spaced away from the silicon surfaces. For example, if the temperature in the initial anneal is close to 800° C., silicon is transported along the portion of the titanium layer extending over the oxide spacers 20 on either side of the gate electrode 14, forming "stringers" 32 between the gate electrode and the source/drain regions 22, 24 that are not removed in the conventional salicide process. Such stringers bridging between the gate silicide layer 26 and the source/drain silicide regions 28, 30 are indicated by reference numeral 32 in FIG. 3. The formation of the stringer 32 in the FIG. 3 structure is obviously undesirable in that it shorts the gate to the source/drain region and renders the transistor inoperative. The high speed at which titanium is transported through polysilicon at the annealing temperatures required to obtain the low resistivity (C54) phase of titanium silicide mandates that the two step annealing process described above be employed. Use of the two step process produces a salicided FET such as that show in FIG. 4 in a process that exhibits a lower probability of bridging problems.

Practice of the two stage process which produces the device of FIG. 4 has disadvantages, however. As a practical matter, use of a single annealing step at a temperature of about 800° C. to directly produce the low resistivity phase of titanium silicide in a one step process is a far more reliable way of producing low resistivity gate electrodes than the two step process. Thus, while the FET illustrated in FIG. 3 is essentially useless in practice, there is a much better likelihood that the one step process indicated by FIG. 3 will produce a low resistivity gate electrode than the two step process used for making the FIG. 4 electrode. This is particularly true for narrow gate electrodes and wiring lines. It becomes increasingly difficult to form acceptable low resistivity salicide electrodes and wiring lines according to the FIG. 4 process when these structures are made using polysilicon lines that are less than one half micron across. In particular, the resistivity of gate electrodes and wiring lines rises precipitously for line widths of less than one half micron. The increase in the resistivity for smaller line widths reflects the fact that the second annealing step conventionally used to produce the low resistivity phase of suicide can be ineffective for such narrow line widths.

A comparison of FIGS. 3 and 4 illustrates a mechanism that is believed to impede the conversion of silicide layers formed on narrow line width polysilicon layers to the low resistivity silicide phase. FIG. 3 shows a titanium silicide layer 26 formed in the generally unacceptable single step annealing process that uses a comparatively uncontrolled initial silicidation process to form a salicide layer 26 which extends deeply into the surface of the illustrated polysilicon gate electrode. The less controlled initial growth process used in forming the FIG. 3 FET tends to produce a gate electrode that has a low resistivity which is desirable regardless of the fact that the FIG. 3 structure is otherwise undesirable. The present inventors have observed that the two step annealing process used in forming the FIG. 4 structure more typically forms a thinner and more constrained titanium silicide layer 34 on the polysilicon gate electrode 14, as illustrated in FIG. 4. Near the edge of the polysilicon gate electrode 14, the gate oxide spacers 20 appear to "clamp" the edges of the titanium silicide layer 34, limiting the growth of the titanium silicide layer which, if not clamped, would have expanded to a thickness greater than the thickness of silicon consumed during the titanium silicide growth process. Titanium silicide grows most freely near the center of the FIG. 4 gate electrode so that the thickest part of the titanium silicide layer 34 is formed above the center of the polysilicon gate electrode 14. Titanium silicide along the edges of the layer 34 has a high level of stress, as initially formed in the first step of the two step annealing process, while the more central portion of the titanium silicide has a comparatively lower level of stress. By contrast, the titanium silicide layer 26 of FIG. 3 has a lower level of stress throughout its width because the low resistivity phase of titanium silicide is formed in the initial annealing step in a comparatively unconstrained manner. If the width of the titanium silicide layer 34 formed in the FIG. 4 process is sufficiently small, then a considerable level of stress will exist even at the center of the titanium silicide layer 34 even after completion of the annealing processes. If too high of a stress level exists across the entire titanium silicide layer as it is formed, then a subsequent annealing step is not successful in converting enough of the titanium silicide layer 34 to the low resistivity phase and so may not reduce the resistivity of the gate electrode in the desired manner. A salicide structure in which the as grown silicide layer has too high of a level of stress may thus produce an undesirably resistive salicide structure which is poorly suited for use as a gate electrode or a wiring line. As such, the silicide layer 26 formed in FIG. 3 is more desirable than the thinner more stressed layer 34 of FIG. 4. On the other hand, the method used for forming FIG. 3 structure is typically unacceptable because of its propensity for bridging, despite the lower gate electrode resistivities achieved through practice that method.

For smaller device geometries, gate electrodes and wiring lines are narrower and it is increasingly more necessary to reduce the resistivity of gate electrodes and wiring lines within memory and logic devices. On the other hand, it is increasingly more difficult to form appropriate salicide electrode structures for narrower gate electrodes and wiring lines. In particular, it is difficult to provide the low resistivity phase of titanium silicide for narrow line width gate electrodes and wiring lines. It is accordingly desirable to develop better designs and more robust processing techniques for forming low resistance salicide structures.

SUMMARY OF THE PREFERRED EMBODIMENTS

In one aspect, the present invention forms a semiconductor device including a polysilicon electrode over a substrate. Spacers are provided on either side of the polysilicon electrode, with upper edges of the spacers extending above an upper surface of the polysilicon electrode and upper recesses separating upper edges of the polysilicon electrode from the spacers. A metal layer is deposited over the polysilicon electrode, the spacers and the substrate, and the device is annealed to form a metal silicide layer on the polysilicon electrode and disposed between the spacers.

In another aspect, the present invention forms a semiconductor device including a polysilicon electrode over a substrate. Spacers are provided on either side of the polysilicon electrode, with lower edges of the spacers separated by a layer of insulating material from the substrate adjacent the polysilicon electrode and the lower edges of the spacers separated from the substrate by lower recesses along outer edges of the spacers. A metal layer is deposited over the polysilicon electrode, the spacers and the substrate, and the device is annealed to form a metal silicide layer on the polysilicon electrode and disposed between the spacers.

In yet another aspect, the invention provides a semiconductor device by providing a polysilicon layer over a substrate and providing a sacrificial layer over the polysilicon layer. The sacrificial layer is patterned to form a patterned sacrificial layer and then the polysilicon layer is patterned to form a polysilicon electrode. A liner layer is formed over edges of the polysilicon electrode and spacers are formed spaced from the polysilicon electrode by the liner layer. Etching is performed to remove the patterned sacrificial layer from between the spacers so that upper edges of the spacers extend above an upper surface of the polysilicon electrode. The liner layer is etched from between the spacers and the polysilicon electrode to form upper recesses. A metal layer is deposited over the polysilicon electrode, the spacers and the substrate, and the device is annealed to form a metal silicide layer on the polysilicon electrode and disposed between the spacers.

BRIEF DESCRIPTION OF THE DRAWINGS

FIGS. 1–4 illustrate process steps for forming a salicide structure and aspects of different failure mechanisms that may arise in salicide processing.

FIGS. 5–9 illustrate stages in the manufacture of MOS devices incorporating salicide structures in accordance with the present invention.

DETAILED DESCRIPTION OF THE PREFERRED EMBODIMENTS

Figure 7:
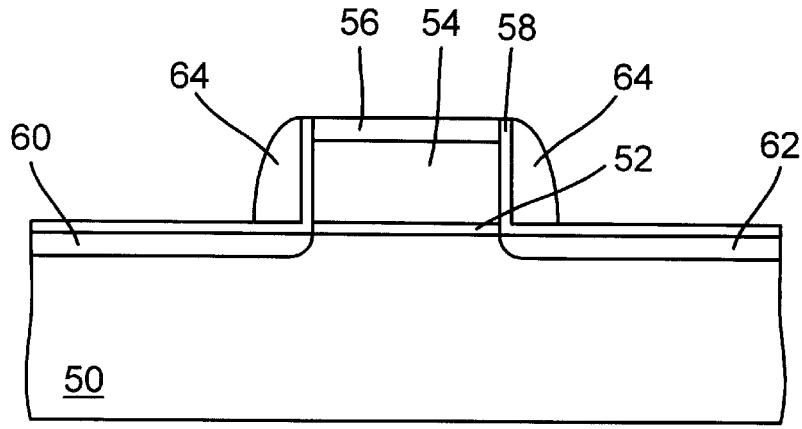

The present inventors believe that, at least for small line widths, it is desirable to form salicide structures using silicide layers having a reduced stress level. To this end, the present inventors have developed the following processes and methods which form a capping silicide layer by silicidation of a polysilicon line having free upper sidewalls so that little or no stress is applied laterally to the polysilicon consumed in the silicidation process. Generally, a polysilicon line is provided having spacers on either side which extend above the upper surface of the polysilicon line and which are spaced from the edge of the polysilicon line. A layer of a metal such as titanium or tungsten is provided in contact with the top surface of the polysilicon line. The structure is annealed to cause the metal to react with the polysilicon to form a layer of silicide. Since the upper side portions of the polysilicon line are spaced away from the spacers during the silicidation anneal, the growing silicide region has room to expand without being subjected to lateral stresses in the silicidation process. The suicide is formed in a reduced stress condition, as compared to conventional processes, so that the silicide layer produced will be more readily converted to the desired low resistivity phase of silicide, as necessary. Practice of certain embodiments of the invention allow for silicidation to be performed in a single annealing step with far greater process latitude than is possible with conventional strategies.

In a particularly preferred embodiment of the present invention, a polysilicon gate electrode or wiring electrode is formed so that its top surface is covered by a layer of a sacrificial material such as silicon oxide or oxynitride. Preferably, the layer of sacrificial material has edges aligned to the edges of the gate electrode. A thin layer of oxide is grown on the sides of the electrode and then a layer of silicon nitride is deposited over the resulting structure. An anisotropic etch back process is performed to etch the layer of silicon nitride back to form spacers on either side of the gate electrode that are separated from the gate electrode by the thin oxide layer. The layer of sacrificial material is removed, preferably in a wet etching process that removes small portions of the thin oxide from between the spacers and the sides of the electrode. The result of this process is that recesses are formed between the upper edges of the polysilicon gate electrode and the spacers and the upper edges of the spacers extend above the surface of the gate electrode. Next, a layer of a refractory metal is deposited over the surface of the electrode and spacers. Most preferably, the deposition process is accomplished using a physical deposition process such as sputtering so that there is poor step coverage between the top edges of the spacers and the gate electrode. The structure is annealed either in a two stage process as before, or in a single stage annealing process followed by an etch to remove unreacted metal. Because of the spacer structures, there is little likelihood that sufficient silicon diffusion will occur through the titanium to produce a bridging problem. As such, a reduced stress silicide layer can be formed with a reduced likelihood of bridging.

Salicide structures that are formed incorporating a reduced stress silicide layer and a preferred method of making such structures are now described in greater detail with reference to FIGS. 5–9. While these figures illustrate particularly preferred embodiments of the present invention within MOS transistors and wiring lines in a particular configuration of a semiconductor device, embodiments of the present invention can be used to form gate electrodes and wiring lines in a wide variety of semiconductor devices. In addition, while the description of the following embodiments emphasizes the formation of NMOS devices, salicide structures in accordance with the present invention may be implemented to advantage in PMOS devices as well. This is true whether the polysilicon of the PMOS gate is doped N-type or P-type. Although it is possible to use the salicide structure described herein only for the gate electrodes (or, conversely, only for the wiring lines) of a device, it is presently believed that it is most desirable to use the described salicide structure for all of the first level polysilicon lines, at least for those devices in which high conductivity electrodes and wiring lines are desirable.

FIG. 5 illustrates in cross section a small portion of a semiconductor circuit incorporating a MOS device at an early stage in the manufacturing process. A P-type substrate 50 is provided and device isolation regions such as field oxide regions are provided as necessary for device isolation around the illustrated device. The channel threshold adjust implantation is performed in the typical manner using, for example, boron or boron fluoride ions for NMOS devices or, for example, arsenic or phosphorus ions for PMOS devices to a dose of between about $3\times10^{11}$ ions/cm$^2$ to about $5\times10^{13}$ ions/cm$^2$ at an energy of between about 5 to 50 KeV. The surface of the active region is then cleaned and a gate oxide layer 52 is grown thermally or deposited by chemical vapor deposition (CVD) over the active device regions of the device to a thickness of between about 30–300 Å. A layer of polysilicon 54 is deposited over the gate oxide layer 52 using low pressure chemical vapor deposition (LPCVD) in the usual manner to form a polysilicon layer having a thickness of about 1,500–4,000 Å. Polysilicon layer 54 is typically doped to render the layer conductive either in situ during deposition or by implantation followed by an activating anneal. For NMOS devices, it is typical to dope the polysilicon layer 54 using phosphorus ions.

Next, a layer of a sacrificial material 56 is provided over the polysilicon layer 54. The layer of sacrificial material 56 has a variety of different preferred uses in embodiments of the present invention. For example, the sacrificial layer 56 is preferably used as a hard mask for the process used to pattern the gate electrodes. In addition, the material and thickness of the sacrificial layer is preferably chosen so that the sacrificial layer functions as a bottom anti-reflection coating for the process used to pattern the sacrificial layer 56 into the preferred hard mask. In this regard, it is preferred that the sacrificial layer be chosen to act as a quarter wave plate for light at the wavelength used for exposing the photoresist over the sacrificial layer 56. Finally, the sacrificial layer is preferably used in forming the spacer structure used in the present invention to form spacers with edges elevated over the gate electrodes. An appropriate sacrificial layer might then be a layer of silicon oxide or silicon oxynitride ($SiO_xN_x$) having a thickness of 200–500 Å. Layer 56 is preferably deposited by CVD to limit consumption of the polysilicon layer.

The polysilicon gate electrode of the subject MOS device is then defined by providing a photoresist mask covering the portion of the sacrificial layer 56 that will be left in place as the hard mask. The exposed portions of the sacrificial layer 56 are then removed by anisotropic etching using an etchant derived in a plasma process from a fluorine-bearing source gas. The photoresist mask is then removed and the polysilicon gate electrode is defined by anisotropic etching using an etchant derived in a plasma process from HCl and HBr source gases and using the sacrificial layer 56 as a hard mask. Often, this process will also etch through the gate oxide layer 52, as shown in FIG. 5, even though it is preferred that the etching process be chosen to stop on the gate oxide layer 52 to protect the substrate. Preferably, the hard mask/sacrificial layer 56 is left in place after patterning the polysilicon layer. The FIG. 5 structure is then subjected to a thermal oxidation process, for example in an oxygen rich environment at a temperature of 800° C. to 1000° C., to grow a thin liner oxide layer 58 over the sides of the polysilicon gate electrode 54. Oxide is a preferred material for the liner layer 58 because oxide is insulating and because oxide can be selectively, isotropically etched without etching silicon or the silicon nitride preferred for the spacers that are later formed in contact with the layer 58. It is particularly preferred that both the layer 58 and the sacrificial layer 56 have a sufficiently similar composition to be etched at least partially in a single etching process, for example in a wet etching process. Other insulators might be chosen for the liner layer, particularly if other materials are used for the spacers. The thickness of the oxide layer establishes the lateral separation that will exist between the upper edges of the polysilicon gate electrode and the spacers during the silicidation process. As discussed above, it is this separation that reduces the stress that might otherwise develop in the silicidation process. Preferably then, the oxide layer is grown to a sufficient thickness to provide the desired spacing between the gate electrode and the spacer, which may be approximately 300–500 Å. For the illustrated gate electrode, it is also preferred that the oxide liner layer 58 extend over the surface of the substrate adjacent to the gate electrode to ensure that the spacers are also spaced from the substrate. The separation between the spacers and the substrate will be opened to form a recess between the spacers and the substrate in a manner that helps reduce the likelihood of bridging, as discussed in greater detail below. The anti-punchthrough implantations and lightly doped drain implantations 60, 62 (FIG. 6) are made in the well known manner, implanting boron, boron fluoride, arsenic or phosphorus ions to a dose of between about $5 \times 10^{12}$ ions/cm$^2$ to about $1 \times 10^{15}$ ions/cm$^2$ at an energy of between about 2 to 80 KeV.

On either side of the gate electrode 54, spacer structures are formed which serve both the conventional purpose of defining the offset between the gate electrode and the more heavily doped portions of LDD source/drain regions as well as providing the desired structure which limits bridging in the silicidation process. The material selected for the spacers is most preferably an insulator and preferably suitable for the selective anisotropic etching of the spacer material using the layer 58 as an etch stop to protect the substrate from etching during the spacer etch back process. As such, silicon nitride is a particularly preferred material for the spacers, although different materials might be provided. The layer 58 might alternately be chosen to be silicon nitride and the spacers might be chosen to be silicon oxide. Spacer structures 64 are formed by depositing a layer of silicon nitride by CVD over the FIG. 6 structure to a thickness of between about 1000–2500 Å. Generally speaking, the thickness of the silicon nitride layer deposited will be approximately equal to the width of the spacers formed, so that the thickness of the silicon nitride layer deposited is set to establish the thickness of the spacers and the desired offset between the gate electrode and the heavily doped portions of the source/drain regions. The spacers are then defined by anisotropically etching back the silicon nitride layer using, for example, etchants derived in a plasma process from a $SF_6$ source gas to produce the structure illustrated in FIG. 7. The heavily doped portions of the source/drain regions 68, 70 (FIG. 8) are then formed by implantation perpendicular to the surface of the substrate. Typically, the heavily doped regions are formed by an implantation of boron, boron fluoride, arsenic, antimony or phosphorus ions to a dose of between about $1 \times 10^{14}$ ions/cm$^2$ to about $1 \times 10^{16}$ ions/cm$^2$ at an energy of between about 5 to 200 KeV. The source/drain regions are then activated by heating the device to a temperature of between about 800° C. to 1100° C. for between 10 seconds (RTA, higher temperature) and 60 minutes (lower temperature).

Etching is then performed to remove the sacrificial layer 56 and to remove portions of the oxide layer 58 from the upper edges of polysilicon gate electrode 54 and from between the spacers and the substrate 50. These etching processes may be accomplished using plasma etching with etchants derived in a plasma process from a fluorine-bearing source gas or by a wet etch using a dilute solution of HF or a similar etchant. Preferably, these etching processes are isotropic or have a significant isotropic component to ensure that a portion of the oxide layer 58 is removed between the spacers 64 and the substrate 50. The preferred result of the etching processes is an oxide layer 66 that is recessed between the gate electrode 54 and the spacers 64 and that is recessed between the spacers 64 and substrate 50. In addition, it is particularly preferred that the spacers 64 extend above the surface of the polysilicon electrode. It is accordingly preferred that the etching processes be chosen to minimize etching of the silicon nitride layer. The recesses between the gate electrode 54 and the spacers 64 allow space for the silicidation process to proceed with little lateral stress generated by the growth of the silicide layer. The recesses between the spacers 64 and the substrate 50 encourage the formation of discontinuities between the substrate and the metal layer deposited over the spacers in the initial phase of the silicidation.

Next, the suicide portion of the salicide structure is formed. As is known in the art, acceptable silicide layers can be formed starting with a number of different base metals, including titanium, tungsten, cobalt, nickel, platinum and palladium. At the present time, titanium silicide is the most widely implemented, but both cobalt and nickel silicides are believed to have desirable characteristics for reduced line width devices. The processing steps characteristic to each of these different suicides are well known and reported in the literature. Accordingly, while the following description is made in terms of titanium silicide, other silicides can also be utilized in this process, in a manner similar to that previously practiced in the art. 12 Thus, a layer of titanium is deposited over the surface of the FIG. 8 device using a physical deposition process to a thickness of, for example, 200–500 Å. Physical deposition processes such as sputtering are preferred because they typically have poor step coverage properties. As such, the titanium layer deposited preferably will not fill in the recesses between the gate electrode 54 and the spacers 64 and the layer will likely have discontinuities at the recesses between the spacers 64 and the substrate 50. The discontinuities in the titanium layer over the spacers and the gate electrode are facilitated both by the recesses and the height of the spacers over the gate electrode. The discontinuities at the upper edges of the gate electrode 54 and between the spacers 64 and the substrate 50 are particularly preferred features of methods in accordance with the present invention, because these discontinuities will prevent silicon transport through the titanium layer over the spacers 64 and will so prevent bridging.

The discontinuities in the metal layer adjacent the gate electrode 54 and the substrate 50 ensure that bridging (such as that illustrated in FIG. 3) should not occur. Thus, it is possible to perform the initial silicidation at a temperature sufficiently high to produce the low resistivity phase of titanium silicide. Accordingly, titanium silicide could be formed by rapid thermal annealing (RTA) at a temperature of about 800–850° C. for about twenty seconds. A subsequent etch in a solution of $NH_4OH$, $H_2O_2$ and $H_2O$ (for example, at a ratio of 1:1:5) removes the unreacted titanium from surfaces including the spacers 64. The result of this single annealing step and clean up etch will be the device illustrated in FIG. 9, which includes a low resistivity titanium silicide layer 72 over the gate electrode and titanium silicide layers 74 and 76 over the source/drain regions 68, 70. Because the titanium silicide layer 72 is not laterally constrained during growth, the titanium silicide layer formed will more naturally form the low resistivity C54 phase. In addition, the FIG. 9 structure is formed in a single step with a low likelihood of bridging problems.

Figure 8:
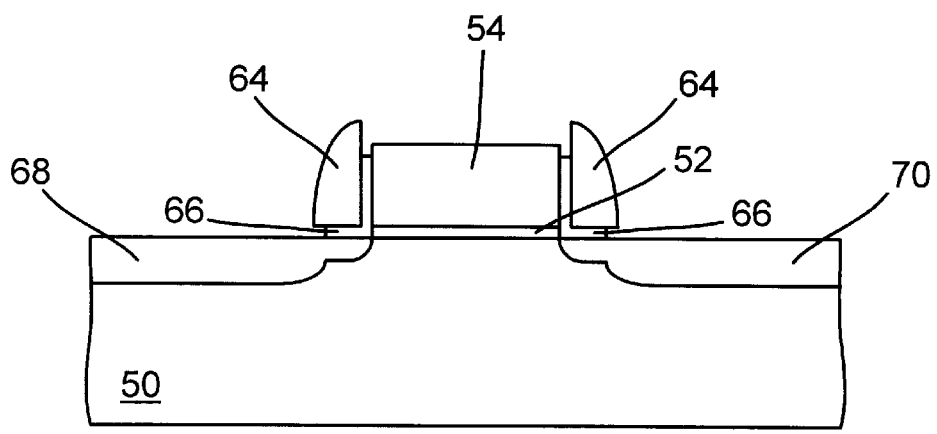

Of course, it remains possible and in some instances desirable to form the titanium silicide layer 72 in the more conventional process using the advantages of the structure shown in FIG. 8 to advantage in the two step process. The existence of the discontinuities in the sputtered titanium layer reduce the criticality of the temperature and other controls for the processing steps in the two-step annealing process. In this alternative, the titanium-deposited structure is subjected to a first RTA at a temperature within the range of 600–750° C., more preferably of about 700° C., for 10 to 120 seconds, more preferably 20 to 60 seconds, in a nitrogen ambient. For cobalt suicide, a temperature of about 550–600° C. is preferably used for the initial silicidation step. Titanium nitride, titanium-rich titanium silicide, titanium oxide and unreacted titanium are then etched from the surface of the device in a solution of $NH_4OH$, $H_2O_2$ and $H_2O$ (for example, at a ratio of 1:1:5), leaving a titanium silicide layer 72 over the gate electrode 54. Titanium silicide regions 74, 76 also remain over the respective source/drain regions 68, 70. The remaining titanium silicide is then converted to the lower resistivity phase in a RTA at a temperature within a range of about 700° C. to 900° C. for between about 10 to 60 seconds. Most preferably, the second RTA is performed at a temperature of about 850° C. for about 20 seconds.

Figure 9:
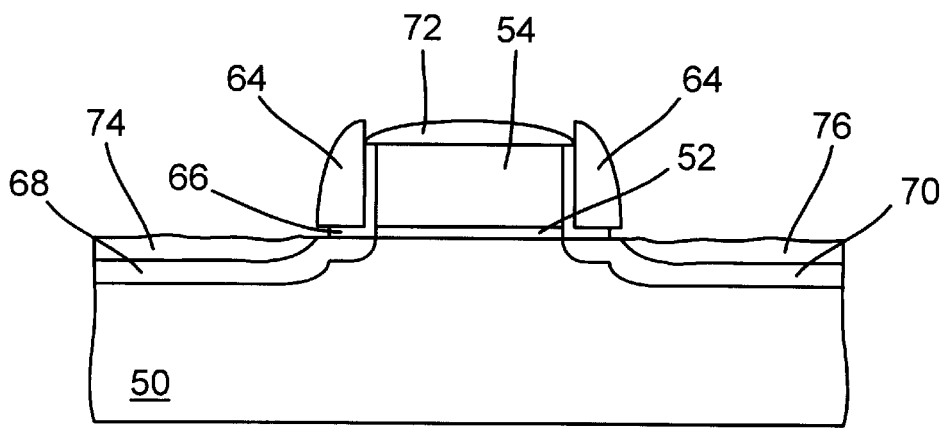

Subsequent processing proceeds in the conventional manner, with the deposition of a interpolysilicon or pre-metal dielectric layer such as atmospheric pressure CVD $SiO_2$ or borophosphosilicate glass (BPSG) over the FIG. 9 structure. Vias are formed through the CVD $SiO_2$ or BPSG down to the suicide regions as necessary, forming polysilicon or metal contacts and first metal or second polysilicon wiring lines and interconnects. The remaining structures and processes are conventional and so are not described further herein. It should be noted that certain configurations of gate electrodes, wiring lines and silicided regions of the substrates sometimes include additional layers of conductive materials such as refractory metals or nitrides of metals (e.g., titanium nitride) formed on top of the salicide structure.

The present invention has been described in terms of certain preferred embodiments. The invention is not, however, limited to the specific embodiments described, but also includes such modifications and variations as fall within the scope of the following claims.

What is claimed:

1. A method of making a semiconductor device comprising:

forming a polysilicon electrode over a substrate;

providing spacers on either side of the polysilicon electrode, upper edges of the spacers extending above an upper surface of the polysilicon electrode, upper recesses separating upper edges of the polysilicon electrode from the spacers;

providing a liner layer having a portion near the polysilicon electrode separating the spacers from the substrate such that outer edges of the spacers are separated from the substrate by lower recesses;

after said providing a liner layer, depositing a metal layer over the polysilicon electrode, the spacers and the substrate; and annealing to form a metal silicide layer on the polysilicon electrode and disposed between the spacers.

2. The method of claim 1 including separating the polysilicon electrode from the spacers on each side by the liner layer, such that the liner layer extends only part of a height of the polysilicon electrode.

3. The method of claim 2, wherein the liner layer comprises an oxide and the spacers comprise a nitride.

4. The method of claim 1, wherein the annealing step consists of a single annealing step.

5. The method of claim 4, wherein the single annealing step is perfonned at a temperature of at least 700° C. which converts the metal layer to the metal silicide layer.

6. The method of claim 5, wherein the step of depositing a metal layer consists of depositing a refractory metal in a sputtering process.

7. The method of claim 1, wherein the step of depositing a metal layer forms a metal layer having a discontinuity adjacent at least one of the lower recesses.

8. The method of claim 1, further comprising the step of forming a sacrificial layer over the polysilicon electrode, wherein the spacers extend above the height of the polysilicon electrode by a thickness of the sacrificial layer.

9. The method of claim 8, wherein the sacrificial layer is used as a hard mask for patterning the polysilicon electrode.

10. The method of claim 9, wherein the sacrificial layer comprises an oxide and the spacers comprise a nitride.

11. A method of making a semiconductor device comprising:

forming a polysilicon electrode over a substrate;

providing spacers on either side of the polysilicon electrode, lower edges of the spacers separated by a layer of insulating material from the substrate adjacent the polysilicon electrode and the lower edges of the spacers separated from the substrate by lower recesses along outer edges of the spacers;

depositing a metal layer over the polysilicon electrode, the spacers and the substrate; and annealing to form a metal silicide layer on the polysilicon electrode and disposed between the spacers.

12. The method of claim 11, wherein:

the polysilicon electrode is positioned over a channel region in the substrate defined on either side by doped source/drain regions, the spacers are positioned at least partially over the doped source/drain regions, the metal layer is deposited on surfaces of the doped source/drain regions, and the annealing step forms metal silicide layers on the doped source/drain regions.

13. The method of claim 12, wherein the step of depositing a metal layer forms the metal layer with a discontinuity adjacent at least one of the lower recesses.

14. The method of claim 13, wherein the spacers are separated from the substrate near the polysilicon electrode by a liner layer that extends only part of a width of each spacer.

15. The method of claim 14, wherein the liner layer comprises an oxide and the spacers comprise a nitride.

16. The method of claim 15, wherein the lower recesses are formed in a wet etching process which selectively etches oxide at a higher rate than nitride is etched.

17. The method of claim 11, wherein upper edges of the spacers extend above an upper surface of the polysilicon electrode, upper recesses separating upper edges of the polysilicon electrode from the spacers.

18. The method of claim 17, wherein the deposited metal layer has a discontinuity adjacent at least one of the upper recesses.

19. The method of claim 12, wherein the annealing step consists of a single annealing step.

20. The method of claim 19, wherein the single annealing step is performed at a temperature of at least 700° C. which converts the metal layer to the metal silicide layer.

21. The method of claim 20, wherein the single annealing step is performed at a temperature of about 800–850° C.

22. The method of claim 13, wherein the metal layer in contact with the spacers remains at least partially unreacted metal during the single annealing step.

23. The method of claim 20, wherein the step of depositing a metal layer consists of depositing a refractory metal in a sputtering process.

24. A method of forming a semiconductor device, the method comprising:

providing a polysilicon layer over a substrate;

providing a sacrificial layer over the polysilicon layer;

patterning the sacrificial layer to form a patterned sacrificial layer and then patterning the polysilicon layer to form a polysilicon electrode;

forming a liner layer over edges of the polysilicon electrode;

forming spacers spaced from the polysilicon electrode by the liner layer;

etching to remove the patterned sacrificial layer from between the spacers so that upper edges of the spacers extend above an upper surface of the polysilicon electrode;

etching the liner layer from between the spacers and the polysilicon electrode to form upper recesses;

separating the spacers from the substrate by a portion of the liner layer near the polysilicon electrode such that outer edges of the spacers are separated from the substrate by lower recesses;

after said separating, depositing a metal layer over the polysilicon electrode, the spacers and the substrate; and annealing to form a metal silicide layer on the polysilicon electrode and disposed between the spacers.

25. The method of claim 24, wherein the liner layer is formed by thermally oxidizing the polysilicon electrode.

26. The method of claim 25, wherein the liner layer is between about 300–500 Å in thickness.

27. The method of claim 24, wherein the patterned sacrificial layer is used as a hard mask for etching the polysilicon layer.

28. The method of claim 24, wherein the sacrificial layer is sized to function as a quarter wave plate during the patterning of the sacrificial layer.

29. The method of claim 24, wherein the step of depositing a metal layer forms a metal layer having a discontinuity adjacent at least one of the lower recesses.

30. The method of claim 12, wherein the annealing step consists of a single rapid thermal annealing step performed at a temperature in the range of about 800—850° C. for about 20 seconds.

31. The method of claim 30, wherein the annealing step forms a low resistivity phase titanium silicide layer over the gate electrode and a further titanium silicide layer over the source/drain regions.

* * * * *